United States Patent
Kyle

[11] Patent Number: 6,059,917
[45] Date of Patent: May 9, 2000

[54] CONTROL OF PARALLELISM DURING SEMICONDUCTOR DIE ATTACH

[75] Inventor: Robert J. S. Kyle, Rowlett, Tex.

[73] Assignee: Texas Instruments Incorporated, Dallas, Tex.

[21] Appl. No.: 08/761,294

[22] Filed: Dec. 6, 1996

Related U.S. Application Data

[60] Provisional application No. 60/008,379, Dec. 8, 1995.

[51] Int. Cl.⁷ .................................................. H05K 13/04
[52] U.S. Cl. ........................................ 156/292; 156/307.7
[58] Field of Search .................................... 156/297, 292, 156/324.4, 313, 309.3, 307.4, 307.7, 306.6, 306.9, 295, 276, 87

[56] References Cited

U.S. PATENT DOCUMENTS

| | | | |
|---|---|---|---|
| 3,142,112 | 7/1964 | Burkig et al. | 29/847 |
| 3,158,927 | 12/1964 | Saunders | 438/113 |
| 3,311,966 | 4/1967 | Shaheen et al. | 29/847 |
| 3,370,203 | 2/1968 | Kravitz et al. | 361/730 |
| 3,378,920 | 4/1968 | Cone | 29/847 |
| 3,555,365 | 1/1971 | Forlani et al. | 257/522 |
| 3,589,004 | 6/1971 | Shaheem | 29/847 |
| 3,627,613 | 12/1971 | Stolki | 156/309.6 |
| 3,666,588 | 5/1972 | Wanesky | 156/249 |
| 3,690,984 | 9/1972 | Wanesky | 438/118 |
| 4,052,787 | 10/1977 | Shaheen et al. | 29/827 |
| 4,103,102 | 7/1978 | Klein | 174/68.5 |
| 4,177,553 | 12/1979 | Klein | 29/625 |
| 4,241,132 | 12/1980 | Pratt et al. | 428/285 |
| 4,861,648 | 8/1989 | Kleinschmidt et al. | 428/40 |
| 4,935,090 | 6/1990 | Brower | 156/307.3 |
| 5,879,502 | 3/1999 | Gustafson | 156/292 |

*Primary Examiner*—Francis J. Lorin
*Attorney, Agent, or Firm*—W. Daniel Swayze, Jr.; Wade James Brady, III; Richard L. Donaldson

[57] ABSTRACT

The invention is to a mounting device (12) and to a method of mounting a semiconductor die (11) to a mounting surface (10) to ensure that the die (11) is in a plane parallel to the mounting surface (10). An intermediate woven mounting device (12) having two parallel faces and having a plurality of co-planer mounting points (13a and 14a) on each of the parallel faces is placed on a semiconductor mounting surface (10) and the semiconductor die (11) is placed on the intermediate device. Along with a die attach adhesive, heat and pressure is applied to secure the semiconductor die (11) and intermediate mounting device (12) to the mounting surface (10).

12 Claims, 1 Drawing Sheet

CONTROL OF PARALLELISM DURING SEMICONDUCTOR DIE ATTACH

This application claims priority under 35 USC §119(e)(1) of provisional application number 60/008,379 filed Dec. 8, 1995.

FIELD OF THE INVENTION

This invention relates to the manufacture of semiconductor devices, and more particularly to maintaining the semiconductor die parallel to the mounting surface on which the semiconductor die is attached.

BACKGROUND OF THE INVENTION

In the manufacturing of semiconductor devices, a semiconductor die is attached to a mounting surface which may be the mounting pad of a lead frame, a mounting surface of a package or other similar mounting areas. If the die is not mounted parallel to the mounting surface, problems may occur later during such operations as wire bonding. Improper bonding can occur if the bonder is programmed to attach bond wires to various positions on a die which are expected to be on a common plane. If the surface is lower than expected, a good bond may not be made. Similarly, if the surface is higher than the other bonding surface, the bonder may exert excess pressure on the bond wire or bond surface, causing a faulty bond.

Attempts have been made to ensure the semiconductor die being parallel with the mounting surface. Such attempts include adding a spacer such as small beads to the epoxy used in attaching the semiconductor die to the mounting surface. Control and distribution of the small beads is difficult with the bead placement being random. The random location of such beads can cause stress in the semiconductor die. The beads may stick to each other, leaving excessive large voids, when compared with the overall mounting surface of the semiconductor die, which causes stress or breakage of the die during attachment or during wire bonding.

SUMMARY OF THE INVENTION

The invention is to a mounting device and to a method of mounting a semiconductor die to a mounting surface to ensure that the die is in a plane parallel to the mounting surface. An intermediate woven mounting device having two parallel faces and having a plurality of co-planer mounting points on each of the parallel faces is placed on a semiconductor mounting surface and the semiconductor die is placed on the intermediate device. Along with a die attach adhesive, heat and pressure is applied to secure the semiconductor die and intermediate mounting device to the mounting surface.

The technical advance represented by the invention as well as the objects thereof will become apparent from the following description of a preferred embodiment of the invention when considered in conjunction with the accompanying drawings, and the novel features set forth in the appended claims.

DESCRIPTION OF A PREFERRED EMBODIMENT

Figure 1:
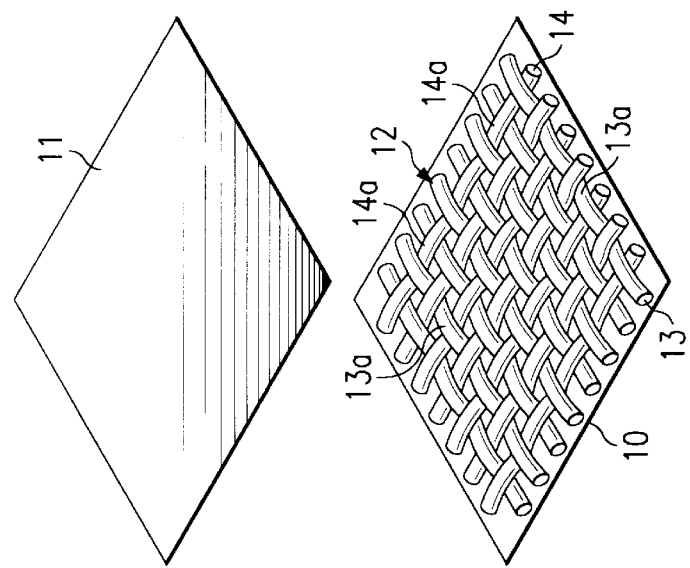
FIG. 1 shows an exploded view of a semiconductor die, mesh and mounting surface.

FIG. 1 shows the use of a woven mesh to ensure that the semiconductor is parallel to the mounting surface 10. Mounting surface 10 may be, for example, the die mount pad of a lead frame or a mounting surface in a semiconductor package. Positioned above mounting surface 10 is semiconductor die 11 which is to be mounted on mounting surface 10. A woven mesh 12 made of interwoven mono-fibers 13 and 14 is placed upon mounting surface 10 and under semiconductor die 11. The mesh is woven so that the strands 13 and 14 are approximately evenly spaced to provide evenly spaced mounting points. These mounting points, 13a and 14a, are the top portions of the woven fibers that will come into contact with the bottom surface of die 11. Similar contact points (not illustrated) will contact the mounting surface 10.

In attaching the semiconductor die 11 to mounting surface 10, a die attach adhesive is placed upon the mounting surface 10 and the mesh 12 and semiconductor die 11 are pressed onto the mounting surface 10. When heat and pressure is applied to the semiconductor die, the die attach adhesive is pressed through mesh 12 to attach semiconductor die 11 to mounting surface 10.

Alternately, the mesh 12 can be impregnated with die attach adhesive. The semiconductor die 11 is then pressed onto mesh 12 while heat is applied, causing mesh 12 to be secured to mounting surface 10, and the semiconductor die 11 adhered to mesh 12.

The distance between mounting surface 10 and the bottom of semiconductor die 11 will be approximately twice the thickness of one strand of the mesh. This results from the weaving of the mono-strands with each strand alternately being over a first transverse strand and under the next, adjacent transverse strand.

While the thicknesses of each strand 13 and 14 is the same, the diameter of each strand is not critical as long as the diameter is uniform along the strand. For example only, a strand may have a diameter of 1 mil. However, the diameter may be selected to be of any practical diameter from several microns to several mils.

Figure 2:
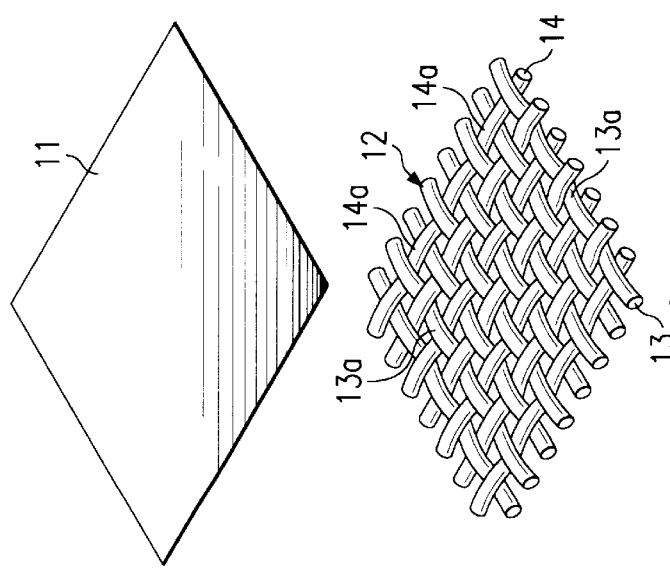
FIG. 2 shows the mesh on the mounting surface prior to attaching the semiconductor die.

FIG. 2 shows mesh 12 on mounting surface 10. Semiconductor die 11 is positioned above mounting surface 10 and mesh 12. While mesh 12 is shown the approximate size of mounting surface, mesh 12 can be smaller than mounting surface 10 as long as it is not smaller than the area of semiconductor die 11.

Figure 3:
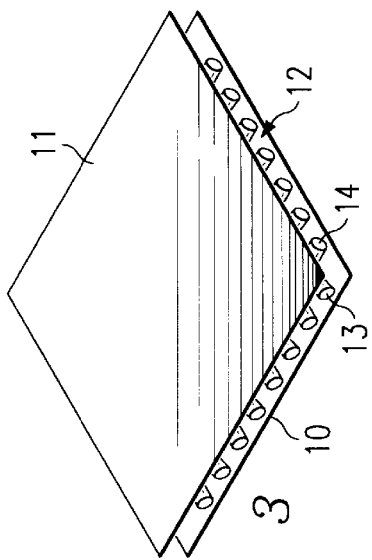
FIG. 3 shows the semiconductor die attached using the mounting mesh.

FIG. 3 shows both mesh 12 and semiconductor die 11 on mounting substrate 10. It is important that mesh 12 extend at least to the periphery of semiconductor die 11. Mesh 12 may extend beyond the periphery of semiconductor die 11, but the edges of mesh 12 should not fall too short of the semiconductor die 11 periphery to let the edges of die 11 extend over mesh 12. This can cause stress or breakage problems when wire bonding to bond pads (not illustrated) on the edges of semiconductor die 11.

What is claimed:

1. A method of mounting a semiconductor die to a mounting surface to ensure that the die is in a plane parallel to the mounting surface, comprising the steps of:

applying a die attach adhesive to a mounting surface;

mounting an intermediate mounting device having two parallel faces and having a plurality of co-planer mounting points on each of the parallel faces;

placing said semiconductor die on the intermediate mounting device; and applying pressure to cause the die attach adhesive to bond the semiconductor die to the intermediate mounting device and the intermediate mounting device to the mounting surface.

2. The method according to claim 1, wherein the intermediate mounting device is a woven mesh.

3. The method according to claim 2, wherein the mesh is woven with mono-fibers.

4. The method according to claim 1, wherein the die attach adhesive is coated onto and in between the fibers of the mesh.

5. The method according to claim 1, wherein heat is applied along with the pressure to secure the semiconductor die to the mesh and the mounting surface.

6. The method according claim 1, wherein the plurality of co-planer mounting points on each of the parallel faces are evenly distributed over each of the parallel faces.

7. A method of mounting a semiconductor die to a mounting surface to ensure that the die is in a plane parallel to the mounting surface, comprising the steps of:

mounting an intermediate mounting device, coated with a die attach adhesive, on the mounting surface, said intermediate mounting device having two parallel faces, and having a plurality of co-planer mounting points on each of the parallel faces;

placing said semiconductor die on the intermediate mounting device; and applying pressure to cause the die attach adhesive to bond the semiconductor die to the intermediate mounting device and the intermediate mounting device to the mounting surface.

8. The method according to claim 7, wherein the intermediate mounting device is a woven mesh.

9. The method according to claim 8, wherein the mesh is woven with non-fibers.

10. The method according to claim 7, wherein the die attach adhesive is coated onto and in between the fibers of the mesh.

11. The method according to claim 7, wherein heat is applied along with the pressure to secure the semiconductor die to the mesh and the mounting surface.

12. The method according to claim 7, wherein the plurality of co-planer mounting points on each of the parallel faces are evenly distributed over each of the parallel faces.

* * * * *